(12) United States Patent
Otremba et al.

(10) Patent No.: US 9,099,441 B2
(45) Date of Patent: Aug. 4, 2015

(54) POWER TRANSISTOR ARRANGEMENT AND METHOD FOR MANUFACTURING THE SAME

(71) Applicant: Infineon Technologies Austria AG, Villach (AT)

(72) Inventors: Ralf Otremba, Kaufbeuren (DE); Josef Hoeglauer, Heimstetten (DE); Juergen Schredl, Mering (DE); Xaver Schloegel, Sachsenkam (DE); Klaus Schiess, Allensbach (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 101 days.

(21) Appl. No.: 13/759,161

(22) Filed: Feb. 5, 2013

(65) Prior Publication Data

US 2014/0217596 A1 Aug. 7, 2014

(51) Int. Cl.
*H01L 23/48* (2006.01)
*H01L 21/50* (2006.01)
(Continued)

(52) U.S. Cl.
CPC ............... *H01L 23/48* (2013.01); *H01L 21/50* (2013.01); *H01L 23/49562* (2013.01); *H01L 23/49575* (2013.01); *H01L 24/40* (2013.01); *H01L 23/3107* (2013.01); *H01L 24/06* (2013.01); *H01L 24/32* (2013.01); *H01L 24/33* (2013.01); *H01L 24/37* (2013.01); *H01L 24/45* (2013.01); *H01L 24/48* (2013.01); *H01L 24/73* (2013.01); *H01L 24/83* (2013.01); *H01L 24/84* (2013.01); *H01L 24/92* (2013.01); *H01L 2224/04026* (2013.01); *H01L 2224/04034* (2013.01); *H01L 2224/04042* (2013.01); *H01L 2224/06181* (2013.01); *H01L 2224/32245* (2013.01); *H01L 2224/33181* (2013.01); *H01L 2224/37011* (2013.01); *H01L 2224/40137* (2013.01); *H01L 2224/45014* (2013.01); *H01L 2224/48137* (2013.01); *H01L 2224/73255* (2013.01); *H01L 2224/73263* (2013.01); *H01L 2224/73265* (2013.01); *H01L 2224/8382* (2013.01); *H01L 2224/8384* (2013.01); *H01L 2224/83191* (2013.01);
(Continued)

(58) Field of Classification Search
CPC ................................ H01L 24/27; H01L 24/34
USPC .......................................... 257/773; 438/107
See application file for complete search history.

(56) References Cited

U.S. PATENT DOCUMENTS 6,157,049 A 12/2000 Mitlehner et al.
7,880,280 B2 2/2011 Otremba
(Continued)

FOREIGN PATENT DOCUMENTS

DE 19610135 C1 6/1997
DE 102005034012 A1 11/2006

OTHER PUBLICATIONS

Abstract for DE102005034012 dated Feb. 6, 2013.

*Primary Examiner* — Walter H Swanson

(57) ABSTRACT

Various embodiments provide a power transistor arrangement. The power transistor arrangement may include a carrier; a first power transistor having a control electrode and a first power electrode and a second power electrode; and a second power transistor having a control electrode and a first power electrode and a second power electrode. The first power transistor and the second power transistor may be arranged next to each other on the carrier such that the control electrode of the first power transistor and the control electrode of the second power transistor are facing the carrier.

15 Claims, 6 Drawing Sheets

(51) Int. Cl.
  *H01L 23/00* (2006.01)
  *H01L 23/495* (2006.01)
  *H01L 23/31* (2006.01)

(52) U.S. Cl.
  CPC .......... *H01L2224/83192* (2013.01); *H01L 2224/83815* (2013.01); *H01L 2224/92246* (2013.01); *H01L 2224/92247* (2013.01); *H01L 2924/1033* (2013.01); *H01L 2924/10272* (2013.01); *H01L 2924/1305* (2013.01); *H01L 2924/1306* (2013.01); *H01L 2924/13055* (2013.01); *H01L 2924/13062* (2013.01); *H01L 2924/13064* (2013.01); *H01L 2924/13091* (2013.01)

(56) References Cited

U.S. PATENT DOCUMENTS

| | | | |
|---|---|---|---|
| 8,227,908 B2 | 7/2012 | Otremba et al. | |
| 2006/0205112 A1* | 9/2006 | Standing et al. | 438/106 |
| 2006/0249836 A1* | 11/2006 | Farlow et al. | 257/706 |
| 2007/0284720 A1* | 12/2007 | Otremba et al. | 257/690 |
| 2008/0230889 A1* | 9/2008 | Standing | 257/693 |
| 2010/0078783 A1* | 4/2010 | Otremba | 257/676 |
| 2012/0068186 A1 | 3/2012 | Otremba | |

* cited by examiner

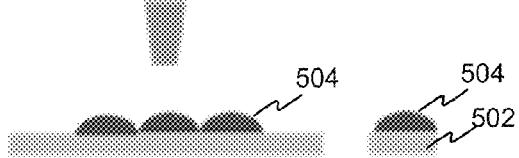
FIG. 5A
FIG. 5B
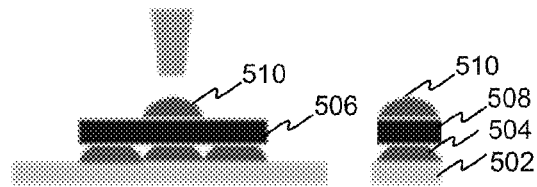
FIG. 5C
FIG. 5D
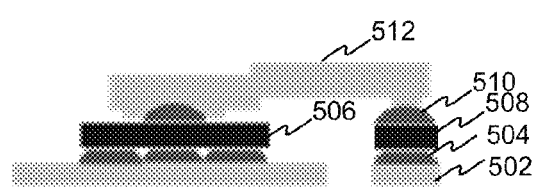
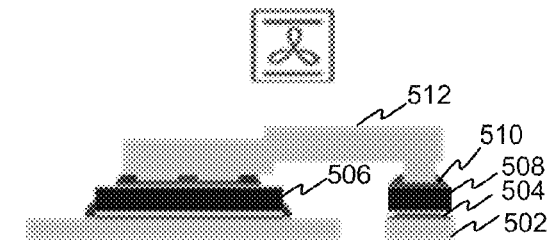
FIG. 5E
FIG. 5F
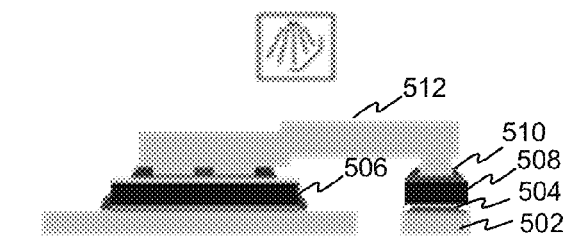
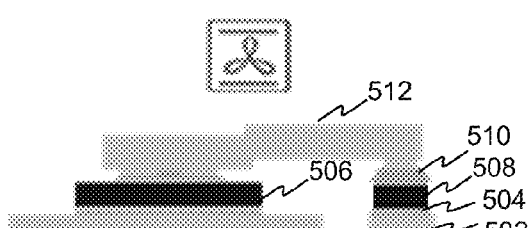
FIG. 5G
FIG. 5H

POWER TRANSISTOR ARRANGEMENT AND METHOD FOR MANUFACTURING THE SAME

TECHNICAL FIELD

Various embodiments relate generally to a power transistor arrangement and a method for manufacturing a power transistor arrangement.

BACKGROUND

Power semiconductor chips may be integrated into an electronic package for various circuitry. For example, a cascade circuit or a half bridge circuit can be implemented by discrete components or packages, or by means of a chip-on-chip structure, in which diffusion soldering may be used.

Discrete components or packages may result in a significant package inductivity and thus switching losses. Whereas a chip-on-chip structure may result in thermal limitations with respect to the chip on the top (e.g. a silicon field effect transistor chip).

SUMMARY

Various embodiments provide a power transistor arrangement. The power transistor arrangement may include a carrier; a first power transistor having a control electrode and a first power electrode and a second power electrode; and a second power transistor having a control electrode and a first power electrode and a second power electrode. The first power transistor and the second power transistor may be arranged next to each other on the carrier such that the control electrode of the first power transistor and the control electrode of the second power transistor are facing the carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 5A-5H show a process of manufacturing a power transistor arrangement according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide a low-inductive package for power applications.

Figure 1:
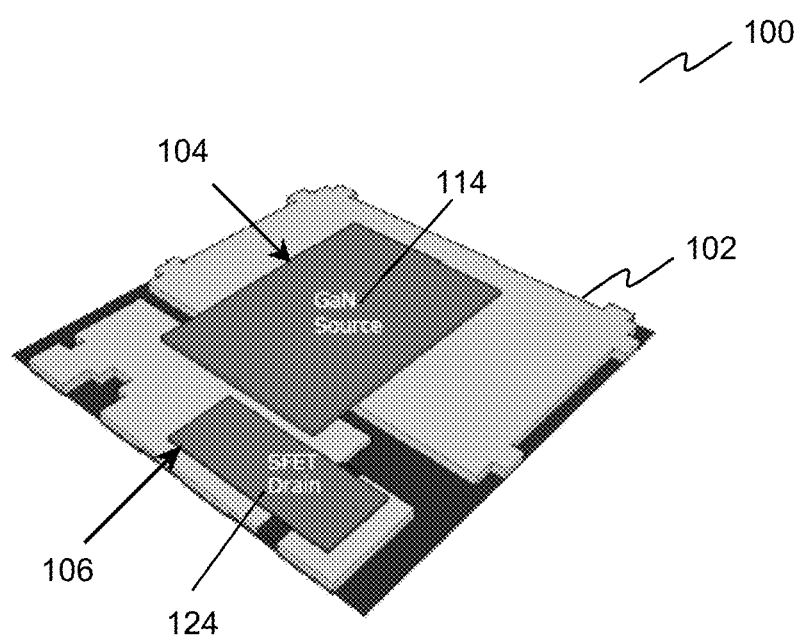
FIG. 1 shows a power transistor arrangement according to various embodiments.
Figure 2:
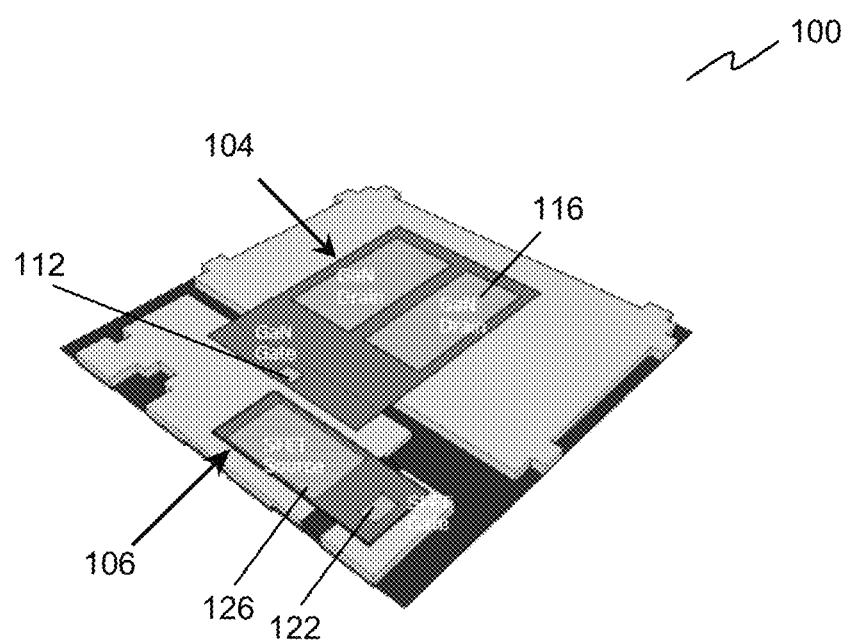
FIG. 2 shows a power transistor arrangement according to various embodiments.
Figure 3:
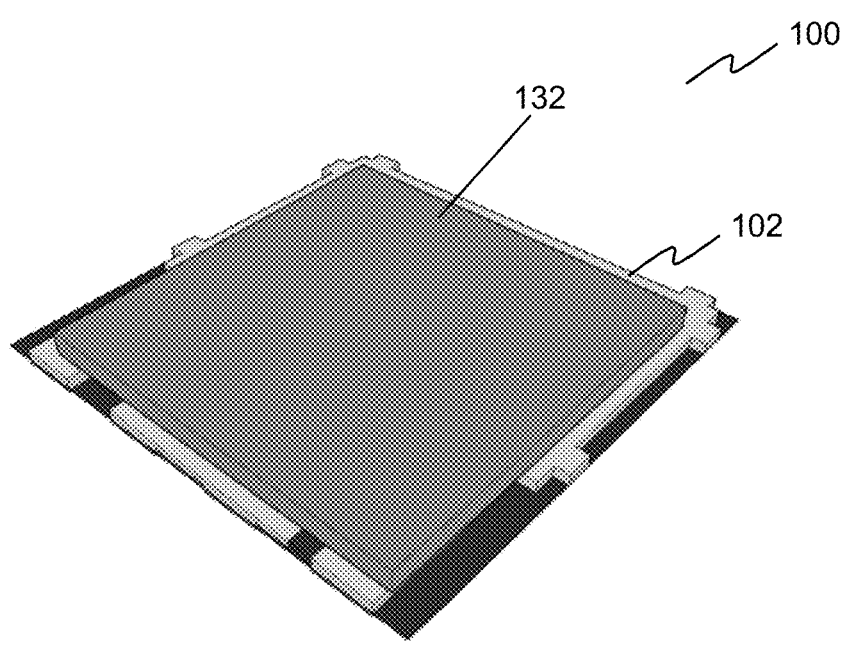
FIG. 3 shows a power transistor arrangement according to various embodiments.

FIGS. 1 to 3 show a power transistor arrangement 100 according to various embodiments.

FIG. 1 shows a top view of the power transistor arrangement 100, and FIG. 2 shows the backside of the power transistor arrangement 100.

The power transistor arrangement 100 may include a carrier 102, a first power transistor 104, and a second power transistor 106. As shown in FIG. 1 and FIG. 2, the first power transistor 104 may include a control electrode 112, a first power electrode 114 and a second power electrode 116; and the second power transistor 106 may include a control electrode 122, a first power electrode 124 and a second power electrode 126. The first power transistor 104 and the second power transistor 106 may be arranged next to each other on the carrier 102, such that the control electrode 112 of the first power transistor 104 and the control electrode 122 of the second power transistor 106 are facing the carrier 102.

In various embodiments, the first power electrode 114 of the first power transistor 104 and the first power electrode 124 of the second power transistor 106 may be facing away from the carrier 102. The first power electrode 114 of the first power transistor 104 and the first power electrode 124 of the second power transistor 106 may be electrically coupled with each other.

The carrier 102 may include a leadframe, which may be made of a metal or a metal alloy, e.g. a material selected from a group consisting of: copper (Cu), iron nickel (FeNi), steel, and the like.

In various embodiments, the first power electrode 114 of the first power transistor 104 and the first power electrode 124 of the second power transistor 106 may be electrically coupled with each other by means of an electrically conductive coupling structure 132 as shown in FIG. 3. The electrically conductive coupling structure 132 may be arranged above the structure shown in FIG. 1, i.e., above the first power electrode 114 of the first power transistor 104 and the first power electrode 124 of the second power transistor 106 which were hidden under the electrically conductive coupling structure 132 in FIG. 3.

In various embodiments, the coupling structure 132 may include at least one of a metal and a metal alloy. In various embodiments, the coupling structure 132 may include at least one structure selected from a group of structures consisting of: a clip, a ribbon, a wire, a plate, and a conductor track. In various embodiments, the coupling structure 132 may have a thermal resistance of 1 K/W or less.

The electrically conductive coupling structure 132 may be electrically isolated from any power transistor arrangement external terminals. The power transistor arrangement external terminals may include leads or pins coupled to the carrier 102, for example.

In accordance with various embodiments, one or both of the first power transistor 104 and the second power transistor 106 may include a MOSFET, a JFET, an IGBT, or a bipolar transistor.

In various embodiments, the first power transistor 104 and the second power transistor 106 may be transistors of the same transistor type. In various embodiments, the first power transistor 104 and the second power transistor 106 may be FETs (field effect transistors) or IGBTs having a voltage rating of about 20 V to 20 kV, for example.

In accordance with various embodiments, the first power transistor 104 and the second power transistor 106 may be of the same voltage class. For example, the first power transistor 104 and the second power transistor 106 may have the same voltage rating, i.e. the same maximum voltage that can be sustained by the first power transistor 104 and the second power transistor 106. The first power transistor 104 and the second power transistor 106 may have different current carrying capabilities.

In accordance with various embodiments, the control electrode 112 of the first power transistor 104 and the control electrode 122 of the second power transistor 106 may be one of the gate electrode of MOSFET, JFET or IGBT transistors, and the base electrode of bipolar transistors.

In accordance with various embodiments, the first power electrode 114 of the first power transistor 104 may be one of the source electrode of a MOSFET or JFET transistor, and the emitter electrode of an IGBT or bipolar transistor. The first power electrode 124 of the second power transistor 106 may be one of the source electrode of a MOSFET or JFET transistor, and the emitter electrode of an IGBT or bipolar transistor. In various embodiments, the first power transistor 104 and the second power transistor 106, being PMOS transistors and having their respective source electrode 114, 124 electrically coupled with each other, may form a two-side blocking PMOS transistor circuit.

In accordance with various embodiments, the first power electrode 114 of the first power transistor 104 may be one of the drain electrode of a MOSFET or JFET transistor and the collector electrode of an IGBT or bipolar transistor; and the first power electrode of the second power transistor may be one of the drain electrode of a MOSFET or JFET transistor and the collector electrode of an IGBT or bipolar transistor. In various embodiments, the first power transistor 104 and the second power transistor 106, being NMOS transistors and having their respective drain electrode 114, 124 electrically coupled with each other, may form a two-side blocking NMOS transistor circuit.

The two-side blocking PMOS transistor circuit or the two-side blocking MMOS transistor circuit formed by the power transistor arrangement 100 of various embodiments may be a two-side blocking switch circuit, which may be used to block voltage in both directions.

In accordance with various embodiments, the first power electrode 114 of the first power transistor 104 may be one of the source electrode of a MOSFET or JFET transistor and the emitter electrode of an IGBT or bipolar transistor. The first power electrode 124 of the second power transistor 106 may be one of the drain electrode of a MOSFET or JFET transistor, and the collector electrode of an IGBT or bipolar transistor. The first power transistor 104 and the second power transistor 106, having their respective first power electrode electrically coupled with each other, may form a cascade circuit or a half bridge circuit. By way of example, the cascade circuit 400 corresponding to the power arrangement 100 is shown in FIG. 4, as will be described in more detail below.

In accordance with various embodiments, the first power transistor 104 may be a HEMT, such as to a GaN HEMT, or an SiC HEMT, or a High-voltage Si HEMT. In accordance with various embodiments, the second power transistor 106 may be a low-voltage (e.g., smaller than 200V) MOSFET (p-channel or n-channel), such as an SFET.

Figure 4:
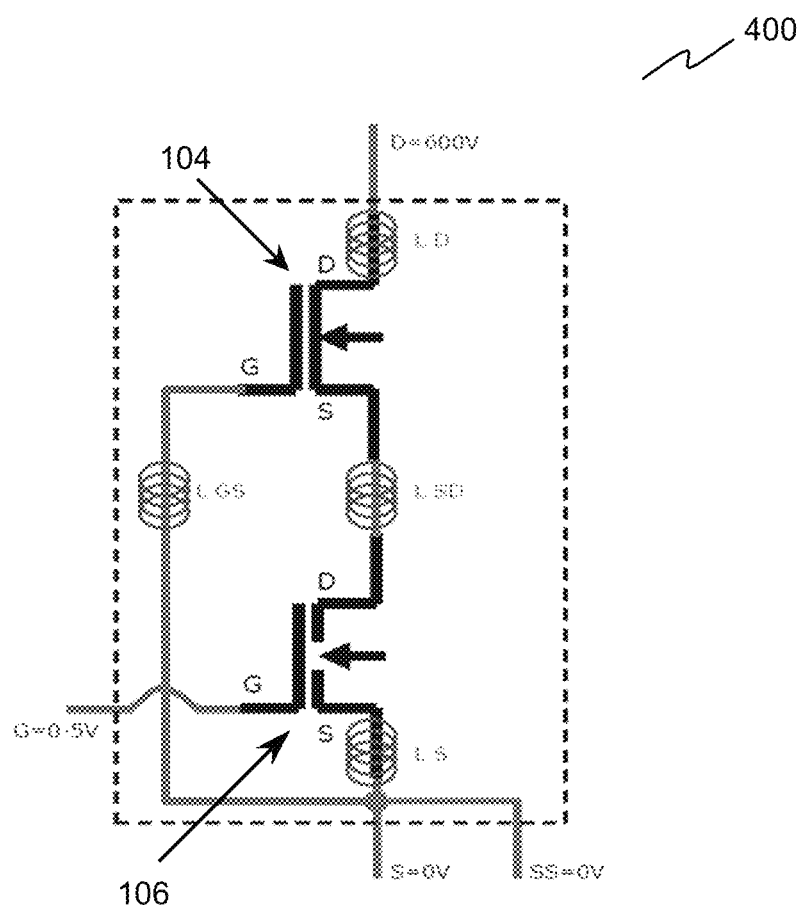
FIG. 4 shows a cascade circuit according to various embodiments.

In the embodiments illustrated in FIG. 1, FIG. 2 and FIG. 4, the first power transistor 104 is a GaN HEMT and the second power transistor 106 is a SFET. However, it is understood that the first power transistor 104 and the second power transistor 106 may be various types of power transistors described above.

As shown in FIG. 1 and FIG. 2, the power transistor arrangement 100 forms a flipchip cascade (FCC) arrangement, in which the gate electrodes 112, 122 of the first GaN HEMT 104 and the SFET 106 are flipped to respective pins on the carrier 102 and thus are connected without the inductivity caused by mounting. Accordingly, the gate electrodes 112, 122 may be re-distributed or re-wired without the need of bond wires or chips.

The FCC arrangement 100 is formed by flipped chips, in which the GaN chip 104 is arranged with its gate electrode 112 and drain electrode 116 facing down (i.e. facing towards the carrier 102) and the SFET chip 106 is arranged with its gate electrode 122 and source electrode 126 facing down (i.e. facing towards the carrier 102). The source electrode 114 of the GaN chip 104 and the drain electrode 124 of the SFET 106 are facing up, i.e. facing away from the carrier 102.

The source electrode 114 of the GaN chip 104 and the drain electrode 124 of the SFET 106 may be connected (e.g. wired) internally, e.g. through the electrically conductive coupling structure 132 of FIG. 3, to form the node point between the GaN chip 104 and the SFET 106 in the cascade circuit 400 of FIG. 4. The connection between the source electrode 114 of the GaN chip 104 and the drain electrode 124 of the SFET 106 does not need an external connection or pin or lead, which makes it possible to optimize the electrically conductive coupling structure 132 (e.g. a contact clip) with respect to its thermal performance, e.g. heat capacity and heat spreading, independent from the package contact area (e.g. package footprint).

Through the arrangement of the power transistor arrangement 100 in various embodiments above in which the control electrodes of the power transistors face down towards the carrier, re-distribution element (i.e. the carrier 102, e.g. lead-frame) is free of any wirebonds.

The power transistor arrangement 100 of various embodiments is simply coolable with little switching losses, and may achieve a performance similar to a chip-on-chip structure but without thermal limitations.

The power transistor arrangement 100 may have a size in the range from about 1 mm$^2$ to 10 cm$^2$.

A package may be provided, including the power transistor arrangement 100 of various embodiment above and package terminals (e.g. pins or leads) configured to receive electrical signals from outside the package. The electrically conductive coupling structure 132 of the power transistor arrangement 100 may be electrically isolated from the package terminals.

In various embodiments, the package may be formed as one of QFN (quad-flat no-leads) packages, DSO (dual small outline) packages, TO220, TO247, TO263, TO252, and the like. In various embodiments, the package may be formed as an embedded package.

In an example, the power transistor arrangement 100 with flipped GaN and SFET chips may be packaged in a 8×8

ThinPAK, wherein the GaN chip 104 may be a high voltage (e.g. larger than 200V) HEMT switch and the SFET chip 106 may be a low voltage (e.g. smaller than 200V) power MOSFET. The GaN HEMT 104 is a normally on device, and is transformed to a normally off transistor with introducing of the low-voltage SFET 106. Such a GaN-SFET arrangement 100 may correspond to the cascade circuit 400 of FIG. 4.

The cascade circuit 400 may include a low voltage SFET 106 in common-source and a high voltage GaN-HEMT 104 in common-gate configuration. The resulting 3-port circuit may act as a switch. The drain electrode of the GaN-HEMT 104 is defining the 600V behavior of the cascade circuit 400.

FIG. 5A to FIG. 5H show a process of manufacturing a power transistor arrangement according to various embodiment.

In FIG. 5A, a carrier 502 is provided. The carrier 502 may include respective die pads for mounting one or more chips.

In FIG. 5B, solder paste 504 is deposited onto the respective areas of the carrier 502, e.g. onto the respective pins on the carrier 502 for connection with the chips.

In FIG. 5C, a first power transistor chip 506 and a second power transistor chip 508 are mounted on the respective solder paste 504. In various embodiments, the first power transistor chip 506 and the second power transistor chip 508 are arranged next to each other and have their control electrodes facing down, i.e. facing towards the carrier 502. In various embodiments, the control electrodes of the first power transistor chip 506 and the second power transistor chip 508 may be connected to the carrier 502 via soft soldering, adhesion, diffusion soldering, sintering, and the like.

In FIG. 5D, solder paste 510 may be deposited onto the first power transistor chip 506 and the second power transistor chip 508. For example, the solder paste 510 may be deposited onto the respective power electrode of the first power transistor chip 506 and the second power transistor chip 508.

In FIG. 5E, an electrically conductive coupling structure 512 may be formed to connect the first power transistor chip 506 and the second power transistor chip 508 through the solder paste 510.

In FIG. 5E, a heating process is performed to melt the solder paste 504, 510.

In FIG. 5F, a cooling process is performed to harden the solder paste 504, 510.

In FIG. 5H, a further heating process is performed, thereby forming the power transistor arrangement having the first power transistor chip 506 and the second power transistor chip 508. The power transistor arrangement thus formed has a vertical structure with a current flowing vertically through the device.

Figure 6:
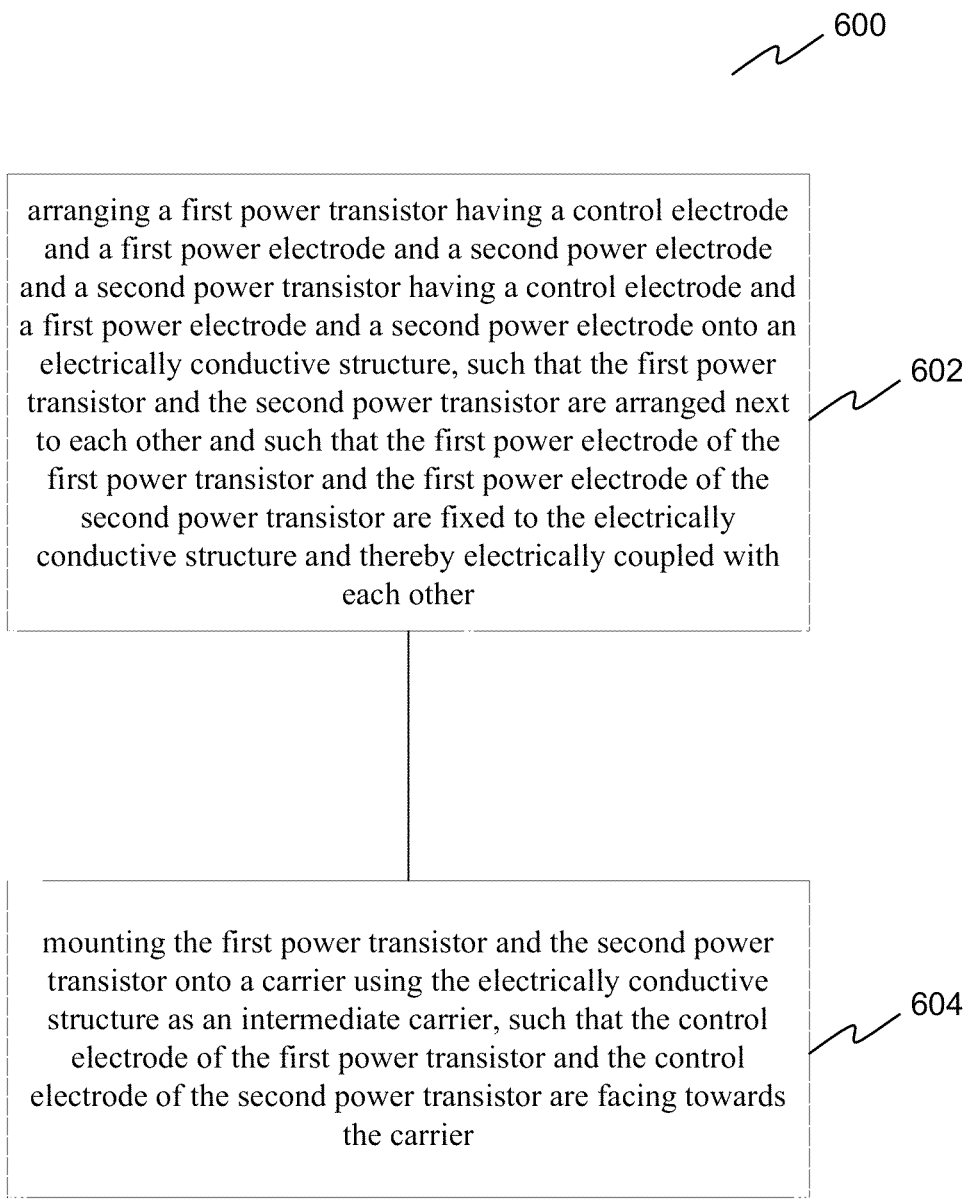
FIG. 6 shows a flowchart illustrating a method for manufacturing a power transistor arrangement according to various embodiments.

FIG. 6 shows a flowchart 600 illustrating a method for manufacturing a power transistor arrangement according to various embodiments.

At 602, a first power transistor having a control electrode and a first power electrode and a second power electrode and a second power transistor having a control electrode and a first power electrode and a second power electrode may be arranged onto an electrically conductive structure, such that the first power transistor and the second power transistor are arranged next to each other and such that the first power electrode of the first power transistor and the first power electrode of the second power transistor are fixed to the electrically conductive structure and thereby electrically coupled with each other.

At 604, the first power transistor and the second power transistor may be mounted onto a carrier using the electrically conductive structure as an intermediate carrier such that the control electrode of the first power transistor and the control electrode of the second power transistor are facing towards the carrier.

In accordance with various embodiments, the first power electrode of the first power transistor and the first power electrode of the second power transistor may be soldered to the electrically conductive structure. In various embodiments, the first power electrode of the first power transistor and the first power electrode of the second power transistor may be soldered to the electrically conductive structure by means of diffusion soldering.

In various embodiments, the control electrode of the first power transistor and the control electrode of the second power transistor may be connected to the carrier, e.g. to the corresponding pins or contact pads of the carrier, by means of soft soldering, adhesion, diffusion soldering, sintering, or the like.

Various embodiments are directed to a power transistor arrangement. The power transistor arrangement may include a carrier; a first power transistor having a control electrode and a first power electrode and a second power electrode; and a second power transistor having a control electrode and a first power electrode and a second power electrode. The first power transistor and the second power transistor may be arranged next to each other on the carrier such that the control electrode of the first power transistor and the control electrode of the second power transistor are facing the carrier.

In various embodiments, the first power electrode of the first power transistor and the first power electrode of the second power transistor may be facing away from the carrier. The first power electrode of the first power transistor and the first power electrode of the second power transistor may be electrically coupled with each other.

The first power electrode of the first power transistor and the first power electrode of the second power transistor may be electrically coupled with each other by means of an electrically conductive coupling structure. In various embodiments, the coupling structure may include at least one of a metal and a metal alloy. The coupling structure may include at least one structure selected from a group of structures consisting of: a clip, a ribbon, a wire, a plate, and a conductor track. The coupling structure may have a thermal resistance of 1 K/W or less.

In accordance with various embodiments, one or both of the first power transistor and the second power transistor may include a MOSFET (Metal Oxide Semiconductor Field Effect Transistor), a JFET (Junction Gate Field Effect Transistor), an IGBT (Insulated Gate Bipolar Transistor), or a bipolar transistor, and the like.

In accordance with various embodiments, the control electrode of the first power transistor and the control electrode of the second power transistor may be one of the gate electrode and the base electrode of the first power transistor and the second power transistor.

In accordance with various embodiments, the first power electrode of the first power transistor may be one of the source electrode and the emitter electrode of the first power transistor, and the first power electrode of the second power transistor may be one of the drain electrode and the collector electrode of the second power transistor. The first power transistor and the second power transistor, having their respective first power electrode electrically coupled with each other, may form a cascade circuit or a half bridge circuit.

In accordance with various embodiments, the first power electrode of the first power transistor may be one of the source electrode and the emitter electrode of the first power transistor; and the first power electrode of the second power transistor may be one of the source electrode and the emitter electrode of the second power transistor. In various embodiments, the first power transistor and the second power transistor, being PMOS (p-channel metal-oxide-semiconductor) transistors and having their respective source electrode electrically coupled with each other, may form a two-side blocking PMOS transistor circuit.

The first power electrode of the first power transistor may be one of the drain electrode and the collector electrode of the first power transistor; and the first power electrode of the second power transistor may be one of the drain electrode and the collector electrode of the second power transistor. In various embodiments, the first power transistor and the second power transistor, being NMOS (n-channel metal-oxide-semiconductor) transistors and having their respective drain electrode electrically coupled with each other, may form a two-side blocking NMOS transistor circuit.

In accordance with various embodiments, the first power transistor may be a High Electron Mobility Transistor (HEMT). Examples of the HEMT may include but are not limited to a GaN (Gallium Nitride) High Electron Mobility Transistor, or an SiC (Silicon Carbide) High Electron Mobility Transistor, or a High-voltage Si (Silicon) High Electron Mobility Transistor. In accordance with various embodiments, the second power transistor may be a low-voltage (e.g., smaller than 200V) MOSFET (p-channel or n-channel). An example of the low-voltage MOSFET may include but is not limited to a SFET (silicon field effect transistor).

In various embodiments, the first power transistor and the second power transistor may be transistors of the same transistor type. In various embodiments, the first power transistor and the second power transistor may be FETs (field effect transistors) or IGBTs having a voltage rating of about 20 V to 20 kV, for example.

In accordance with various embodiments, the first power transistor and the second power transistor may be of the same voltage class. For example, the first power transistor and the second power transistor may have the same voltage rating, i.e. the same maximum voltage that can be sustained by the first power transistor and the second power transistor. In one embodiment, the first power transistor and the second power transistor may have different current carrying capabilities.

The electrically conductive coupling structure for electrically coupling the first power transistor and the second power transistor may be electrically isolated from any power transistor arrangement external terminals. The power transistor arrangement external terminals may include leads or pins coupled to the carrier, for example.

The carrier may include a leadframe, which may be made of a metal or a metal alloy, e.g. a material selected from a group consisting of: copper (Cu), iron nickel (FeNi), steel, and the like.

Various embodiments are further directed to a package, which may include a power transistor arrangement. The power transistor arrangement may include a carrier; a first power transistor having a control electrode and a first power electrode and a second power electrode; and a second power transistor having a control electrode and a first power electrode and a second power electrode. The first power transistor and the second power transistor may be arranged next to each other on the carrier such that the control electrode of the first power transistor and the control electrode of the second power transistor are facing towards the carrier; and the first power electrode of the first power transistor and the first power electrode of the second power transistor are facing away from the carrier. The first power electrode of the first power transistor and the first power electrode of the second power transistor may be electrically coupled with each other by means of an electrically conductive coupling structure. The package may further include package terminals configured to receive electrical signals from outside the package. The electrically conductive coupling structure may be electrically isolated from the package terminals.

Various embodiments described with regard to the power transistor arrangement above are analogously valid for the package including the power transistor arrangement.

In various embodiments, the package may be formed as one of QFN (quad-flat no-leads) packages, DSO (dual small outline) packages, TO220, TO247, TO263, TO252, and the like. In various embodiments, the package may be formed as an embedded package.

Further embodiments are directed to a method for manufacturing a power transistor arrangement. The method may include arranging a first power transistor having a control electrode and a first power electrode and a second power electrode and a second power transistor having a control electrode and a first power electrode and a second power electrode onto an electrically conductive structure such that the first power transistor and the second power transistor are arranged next to each other and such that the first power electrode of the first power transistor and the first power electrode of the second power transistor are fixed to the electrically conductive structure and thereby electrically coupled with each other; and mounting the first power transistor and the second power transistor onto a carrier using the electrically conductive structure as an intermediate carrier such that the control electrode of the first power transistor and the control electrode of the second power transistor are facing towards the carrier.

In accordance with various embodiments, the first power electrode of the first power transistor and the first power electrode of the second power transistor may be soldered to the electrically conductive structure. In various embodiments, the first power electrode of the first power transistor and the first power electrode of the second power transistor may be soldered to the electrically conductive structure by means of diffusion soldering.

In various embodiments, the control electrode of the first power transistor and the control electrode of the second power transistor may be connected to the carrier, e.g. to the corresponding pins or contact pads of the carrier, by means of soft soldering, adhesion, diffusion soldering, sintering, or the like.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A power transistor arrangement, comprising:
   a carrier;
   a first power transistor comprising a first chip having a control electrode and a first power electrode and a second power electrode, wherein the control electrode and the second electrode are at a first side of the first chip and the first electrode is at a second side of the first chip that is opposite to the first side;
   a second power transistor comprising a second chip having a control electrode and a first power electrode and a second power electrode, wherein the control electrode and the second electrode are at a first side of the second chip and the first electrode is at a second side of the second chip that is opposite to the first side;

wherein the first power electrode of the first power transistor and the first power electrode of the second power transistor are facing away from the carrier and are electrically coupled with each other by means of an electrically conductive coupling structure arranged above the first and second power electrodes, wherein the first power transistor and the second power transistor are arranged next to each other on the carrier such that the control electrode of the first power transistor and the control electrode of the second power transistor are facing the carrier, and wherein the electrically conductive coupling structure is electrically isolated from any power transistor arrangement external terminals.

2. The power transistor arrangement of claim 1, wherein the coupling structure comprises at least one of a metal and a metal alloy.

3. The power transistor arrangement of claim 1, wherein the coupling structure comprises at least one structure selected from a group of structures consisting of:
a clip;
a ribbon;
a wire;
a plate; and
a conductor track.

4. The power transistor arrangement of claim 1, wherein the coupling structure has a thermal resistance of 1 K/W or less.

5. The power transistor arrangement of claim 1, wherein the first power electrode of the first power transistor is one of a source electrode and an emitter electrode of the first power transistor;
wherein the first power electrode of the second power transistor is one of a drain electrode and a collector electrode of the second power transistor.

6. The power transistor arrangement of claim 1, wherein the first power electrode of the first power transistor is one of a source electrode and an emitter electrode of the first power transistor;
wherein the first power electrode of the second power transistor is one of a source electrode and an emitter electrode of the second power transistor.

7. The power transistor arrangement of claim 1, wherein the first power electrode of the first power transistor is one of a drain electrode and a collector electrode of the first power transistor;
wherein the first power electrode of the second power transistor is one of a drain electrode and a collector electrode of the second power transistor.

8. The power transistor arrangement of claim 1, wherein the first power transistor is a High Electron Mobility Transistor.

9. The power transistor arrangement of claim 8, wherein the High Electron Mobility Transistor is one of a Gallium Nitride High Electron Mobility Transistor, a Silicon Carbide High Electron Mobility Transistor, and a High-voltage Silicon High Electron Mobility Transistor.

10. The power transistor arrangement of claim 1, wherein the second power transistor is low-voltage metal oxide semiconductor field effect transistor.

11. The power transistor arrangement of claim 1, wherein the first power transistor and the second power transistor are transistors of the same transistor type.

12. The power transistor arrangement of claim 11, wherein the first power transistor and the second power transistor are one of a field effect transistor and an insulated gate bipolar transistor.

13. The power transistor arrangement of claim 1, wherein the first power transistor and the second power transistor are of the same voltage class.

14. The power transistor arrangement of claim 1, the electrically coupling structure comprises an exposed surface facing away from the first and second power transistors.

15. A package, comprising:
a power transistor arrangement, comprising:
a carrier;
a first power transistor comprising a first chip having a control electrode and a first power electrode and a second power electrode, wherein the control electrode and the second electrode are at a first side of the first chip and the first electrode is at a second side of the first chip that is opposite to the first side;
a second power transistor comprising a second chip having a control electrode and a first power electrode and a second power electrode, wherein the control electrode and the second electrode are at a first side of the second chip and the first electrode is at a second side of the second chip that is opposite to the first side;
wherein the first power transistor and the second power transistor are arranged next to each other on the carrier such that the control electrode of the first power transistor and the control electrode of the second power transistor are facing towards the carrier;
wherein the first power electrode of the first power transistor and the first power electrode of the second power transistor are facing away from the carrier; and
wherein the first power electrode of the first power transistor and the first power electrode of the second power transistor are electrically coupled with each other by means of an electrically conductive coupling structure;
package terminals configured to receive electrical signals from outside the package;
wherein the electrically conductive coupling structure is electrically isolated from the package terminals.

* * * * *